(12) United States Patent
Peng et al.

(10) Patent No.: US 11,957,035 B2
(45) Date of Patent: Apr. 9, 2024

(54) MASK ASSEMBLY AND DISPLAY DEVICE INCLUDING ISLAND SHELTERS CONTACTING SUBSTRATE THROUGH MOUNTING HOLES

(71) Applicant: KUNSHAN GO-VISIONOX OPTO-ELECTRONICS CO., LTD., Kunshan (CN)

(72) Inventors: Chao Chi Peng, Kunshan (CN); Mingxing Liu, Kunshan (CN); Shuaiyan Gan, Kunshan (CN); Zhiyuan Zhang, Kunshan (CN); Weili Li, Kunshan (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 427 days.

(21) Appl. No.: 17/395,474

(22) Filed: Aug. 6, 2021

(65) Prior Publication Data

US 2021/0367218 A1 Nov. 25, 2021

Related U.S. Application Data

(63) Continuation of application No. PCT/CN2020/080836, filed on Mar. 24, 2020.

(30) Foreign Application Priority Data

Jul. 31, 2019 (CN) .......................... 201910704909.8

(51) Int. Cl.
*H10K 71/00* (2023.01)
*H10K 50/822* (2023.01)
(Continued)

(52) U.S. Cl.
CPC ............ *H10K 71/00* (2023.02); *H10K 50/822* (2023.02); *H10K 59/12* (2023.02); *H10K 59/1201* (2023.02); *H10K 2102/351* (2023.02)

(58) Field of Classification Search
CPC .. H10K 50/822; H10K 59/12; H10K 59/1201; H10K 59/80521; H10K 71/00;
(Continued)

(56) References Cited

U.S. PATENT DOCUMENTS

| 9,710,059 B2 | 7/2017 | Leng |
| 11,018,327 B2 | 5/2021 | Wang et al. |

(Continued)

FOREIGN PATENT DOCUMENTS

| CN | 104409472 A | 3/2015 |
| CN | 104862647 A | 8/2015 |

(Continued)

OTHER PUBLICATIONS

Office Action of JP Patent Application No. 2022-502299 dated Jan. 17, 2023.
(Continued)

*Primary Examiner* — Matthew E. Gordon
(74) *Attorney, Agent, or Firm* — KILPATRICK TOWNSEND & STOCKTON LLP

(57) ABSTRACT

The present application provides a mask assembly and a display device. The display device comprises a display area and at least one non-display area, the display area surrounding the non-display area; the display device further comprises a transitional-display area adjoining the non-display area as well as the display area, respectively, wherein both the display area and the transitional-display area are used to display static or dynamic images; a thickness of a first electrode in the transitional-display area is smaller than or equal to a thickness of the first electrode in the display area.

(Continued)

The presence of the transitional-display area prevents incomplete display caused by incomplete coverage of the evaporation material in the display device, such as black-edged display formed in an area where a connection bridge is located, thereby improving the display integrity.

7 Claims, 5 Drawing Sheets

(51) Int. Cl.
*H10K 59/12* (2023.01)
*H10K 102/00* (2023.01)

(58) Field of Classification Search
CPC .... H10K 71/164; H10K 71/166; H10K 71/60; H10K 71/621; H10K 2102/351
USPC .......................................................... 257/80
See application file for complete search history.

(56) References Cited

U.S. PATENT DOCUMENTS

| | | |
|---|---|---|
| 2008/0137003 A1 | 6/2008 | Louwsma et al. |
| 2013/0122254 A1 | 5/2013 | Liang |
| 2016/0333457 A1* | 11/2016 | Ma .................. C23C 14/042 |
| 2018/0040857 A1 | 2/2018 | Hong et al. |
| 2018/0198067 A1* | 7/2018 | Kim .................. C23C 14/042 |
| 2020/0190655 A1 | 6/2020 | Zhu et al. |
| 2021/0020871 A1* | 1/2021 | Wang ................ C23C 14/042 |
| 2021/0119187 A1 | 4/2021 | Liu et al. |

FOREIGN PATENT DOCUMENTS

| | | | | |
|---|---|---|---|---|
| CN | 107236927 A | | 10/2017 | |
| CN | 107741870 A | | 2/2018 | |
| CN | 108004504 A | | 5/2018 | |
| CN | 108277473 A | * | 7/2018 | ........... C23C 16/042 |
| CN | 108277473 A | | 7/2018 | |
| CN | 108559948 A | | 9/2018 | |
| CN | 108648695 A | | 10/2018 | |
| CN | 109166976 A | | 1/2019 | |
| CN | 107236927 A | | 3/2019 | |
| CN | 109860435 A | * | 6/2019 | |
| CN | 109860435 A | | 6/2019 | |
| CN | 110018610 A | * | 7/2019 | ............... G03F 1/64 |
| CN | 110018610 A | | 7/2019 | |
| CN | 209070895 U | | 7/2019 | |
| CN | 110438446 A | | 11/2019 | |
| EP | 3736862 A2 | | 11/2020 | |
| JP | 2013156622 A | | 8/2013 | |
| TW | I371007 B | | 8/2012 | |
| TW | 201602851 A | | 1/2016 | |
| TW | I594049 B | | 8/2017 | |

OTHER PUBLICATIONS

Extended European Search Report for corresponding European Application No. 20846269.7.
International Search Report for Appl. No. PCT/CN2020/080836.
Notification of Taiwan First Office Action for corresponding Appl. No. TW202028857A.
Chinese Notification of First Office Action for corresponding Chinese Appl. No. CN 110438446 A.

* cited by examiner

C-C

MASK ASSEMBLY AND DISPLAY DEVICE INCLUDING ISLAND SHELTERS CONTACTING SUBSTRATE THROUGH MOUNTING HOLES

CROSS-REFERENCES TO RELATED APPLICATIONS

The present application is a continuation of International Application No. PCT/CN2020/080836 filed on Mar. 24, 2020, which claims priority to Chinese Patent Application No. 201910704909.8 filed on Jul. 31, 2019. Both applications are incorporated by reference herein in their entireties.

TECHNICAL FIELD

The present application relates to the field of display technology, and particularly relates to a mask assembly and a display device.

BACKGROUND OF THE INVENTION

In a manufacturing process of a display panel, evaporation coating technology is usually used to form the respective layers of the display panel, such as a gate electrode layer, a source electrode layer and a drain electrode layer of a thin film transistor, a light-emitting layer and a cathode layer of an organic light-emitting unit, as well as inorganic layers such as an insulation layer and a buffer layer. When a layer is formed on a substrate to be processed by evaporation coating, a mask is utilized to shield the areas on the substrate that do not need to be processed by evaporation coating, so as to form a layer with a specific pattern.

For a display device in the prior art, in order to reserve a mounting space for other electronic elements, such as a camera, a speaker, a phone, etc., an open part for mounting the corresponding electronic element needs to be provided in a display area, and because the material of some material layer is not easy to be removed, the open part needs to be shielded before the evaporation coating is performed, therefore, the mask used for evaporation coating needs to be provided with a shelter part for shielding the open part; usually, the open part is not arranged directly adjacent to an edge of the display screen, but has a certain distance from an edge of the display screen, therefore, in the prior art, the shelter part is connected to a frame of the mask by an arm (support bar), the presence of the arm leads to that a normal display area is partially blocked during the evaporation coating process in such a way that the evaporation material cannot be formed in the area blocked by the arm, and thus a black stripe line is formed, which adversely affects the normal display effect of the display screen.

BRIEF SUMMARY OF THE INVENTION

In view of this, it is necessary to provide a mask assembly which can avoid a black stripe line being formed in a display area.

According to a first aspect, an embodiment of the present application provides a mask assembly, comprising:
- a mask frame, supported on a surface of a substrate and having an open area;
- a plurality of island shelters, located in the open area and in contact with the surface of the substrate;
- and a connection bridge, spaced apart from the surface of the substrate;
- wherein, at least one of the island shelters is connected to the mask frame or a neighboring island shelter via the connection bridge.

According to a second aspect, an embodiment of the present application also provides a display device, comprising a display area configured to display static or dynamic images; at least one non-display area surrounded by the display area; and a transitional-display area adjacent to both the non-display area and the display area and configured to display static or dynamic images, wherein a thickness of a first electrode in the transitional-display area is smaller than or equal to a thickness of the first electrode in the display area.

According to a third aspect, an embodiment of the present application also provides a method of manufacturing the above-mentioned display device, comprising the steps of:
- S1: providing a substrate, and sequentially forming an array circuit, an anode layer and a light-emitting layer on the substrate;
- S2: forming a first cathode layer upon the light-emitting layer with cathode material processed by evaporation coating;
- S3: forming a mounting hole in a non-display area by etching;
- S4: using the above-mentioned mask assembly to shield the area where the mounting hole is located, and forming a second cathode layer with cathode material processed by evaporation coating;
- wherein, the second cathode layer covers both a transitional-display area and a display area, and the first cathode layer produced in the step S2 and the second cathode layer produced in the step S4 together constitute a cathode layer of the display device.

The technical solutions of the present application have the following advantages.

By arranging the connection bridge to be suspended, when depositing an material processed by evaporation coating in an evaporation coating process, the deposited layer parts on both sides of the connection bridge can diffuse through the gap under the connection bridge and become interconnected together, so that the thickness of the deposited layer under the connection bridge can meet the basic requirements, that is to say, the evaporation material enters the gap thereunder between the connection bridge and the substrate from both sides of the connection bridge, so as to interconnect the evaporation material in the open area on both sides of the connection bridge, thereby preventing the situation that the area under the connection bridge cannot be covered by the evaporation material due to the presence of the connection bridge, and thus a secondary evaporation coating process performed on the area shielded by the connection bridge for ensuring the display integrity can be dispensed with.

By providing two connection bridges, the island shelter can be firmly supported inside the mask frame, and as each connection bridge extends in a direction through the center of the island shelter, the supporting strength for the island shelter is further increased.

The transitional-display area prevents incomplete display caused by incomplete coverage of the evaporation material in the display device, such as black-edged display formed in an area where a connection bridge is located, thereby improving the display integrity.

By using the two steps of S2 and S4 to form the cathode layer together, it can be ensured that at least the first cathode layer is present in the transitional-display area, so that it is ensured that the transitional-display area is electrically conductive, thereby ensuring the normal display of the manufactured display device.

DETAILED DESCRIPTION OF THE INVENTION

A clear and complete description of the technical solution of the present application is given below, in conjunction with the appended drawings. Apparently, the described embodiments are part of, but not all of, the embodiments of the present application. All the other embodiments, obtained by a person with ordinary skill in the art on the basis of the embodiments in the present application without expenditure of creative labor, belong to the protection scope of the present application.

Figure 1:
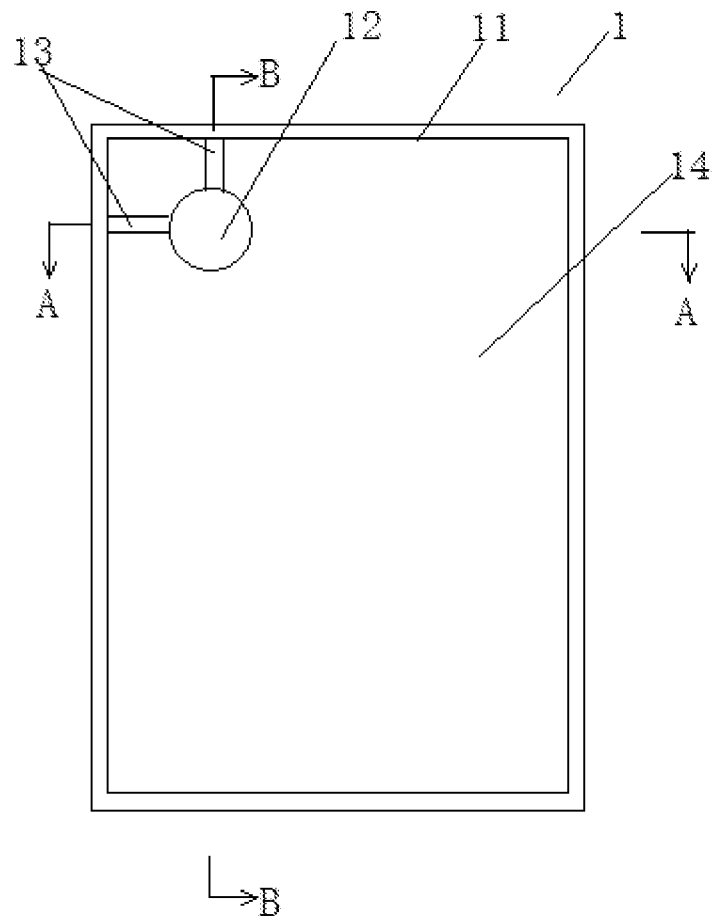
FIG. 1 is a structural schematic diagram of a mask assembly of the present application.

As shown in FIG. 1, this embodiment provides a mask assembly 1 used for evaporation coating. The mask assembly 1 comprises a mask frame 11, a plurality of island shelters 12 and a connection bridge 13, at least one of the island shelters 12 being connected to the mask frame 11 or a neighboring island shelter 12 via the connection bridge 13. The mask frame 11 is supported on the peripheral surface of a substrate, that is, the mask frame 11 is not used for shielding the evaporation material. The mask frame 11 has an open area 14 that allows entry and deposition of the evaporation material. The island shelter 12 is located in the open area 14 and used for shielding the evaporation material to form a shielded area. The substrate refers to a base material to be processed by evaporation coating thereon, and in this embodiment, the mask frame 11 is a rectangular-frame support plate, the open area 14 as well as the shielded area constituted by the island shelter 12 and the connection bridge 13 are formed inside the rectangular-frame support plate.

In this embodiment, the island shelter 12 is located inside the open area 14 to be in contact with the surface of the substrate and is surrounded by the open area 14. The island shelter 12 comprises a round shelter plate and/or a rectangular shelter plate. In this embodiment, one island shelter 12 in the form of a round shelter plate is provided in the open area 14 inside the mask frame 11. The island shelter 12 is connected to the mask frame 11 via a connection bridge 13 and the island shelter 12 is supported by the connection bridge 13 to hang in the mask frame 11. Of course, the island shelter 12 is not limited to being provided in a rectangular shape or a round shape, it may also be in other shapes such as an oval shape, a diamond shape, a hexagonal shape, the mask frame 11 is not limited to being provided in a rectangular-frame shape, and it may also be in other shapes such as a circular frame, an oval frame, a diamond frame, a hexagonal frame.

Figure 10:
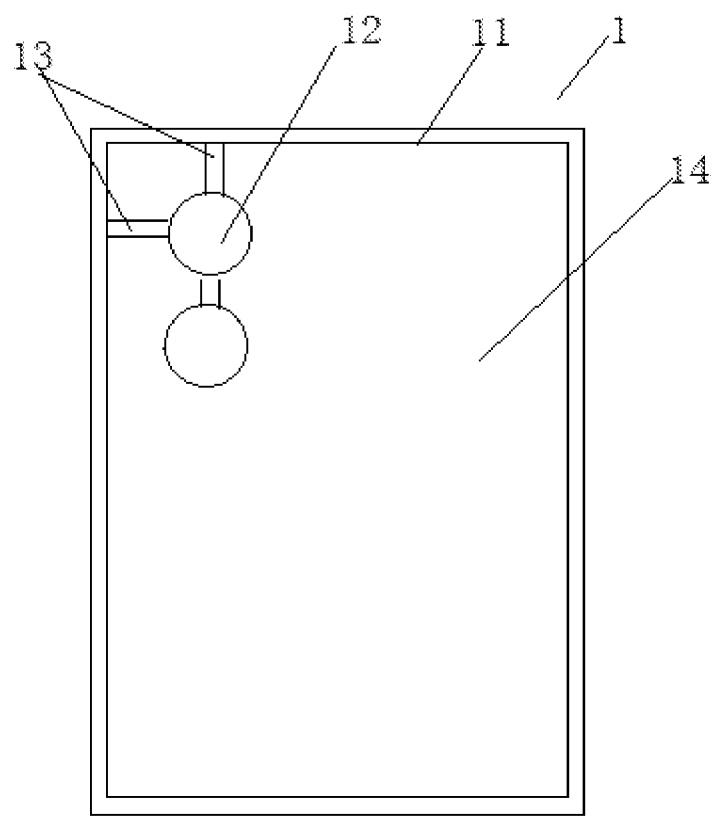
FIG. 10 is a structural schematic diagram of another mask assembly.

Of course, it is not limited to that there is only one island shelter 12, two or more island shelters 12 may be provided. When other island shelters 12 or other shelter patterns are also provided inside the rectangular frame, the plurality of island shelters 12 may be interconnected by a connection bridge 13, or the island shelter 12 may also be connected to another shelter pattern or another island shelter by a connection bridge 13. FIG. 10 shows a case in which two island shelters 12 are provided, the two island shelters 12 are interconnected by a connection bridge 13, and one or two island shelters 12 thereof are connected to the mask frame 11 by connection bridge 13.

In this embodiment, the connection bridge 13 has a stripe shape, and the connection bridge 13 is arranged along a straight line that passes through a center of the island shelter 12. As the island shelter 12 has a round shape, the connection bridge 13 may be arranged along a straight line that passes through a circle center of the round island shelter 12 to increase the supporting strength provided by the connection bridge 13 to the island shelter.

Referring to FIG. 1, in this embodiment, two connection bridges are provided on the periphery of the island shelter 12 and extending along different directions to connect the island shelter 12 onto different parts of the mask frame 11. The two connection bridges in this embodiment are arranged with an intersection angle of 90°. Of course, the intersection angle between the two connection bridges 13 is not limited to being 90°. By providing two connection bridges, the island shelter 12 can be firmly supported inside the mask frame, and of course, more connection bridges 13 may also be provided, each connection bridge 13 extends in a direction through the center of the island shelter 12, thereby further increasing the supporting strength for the island shelter 12.

Figure 2:
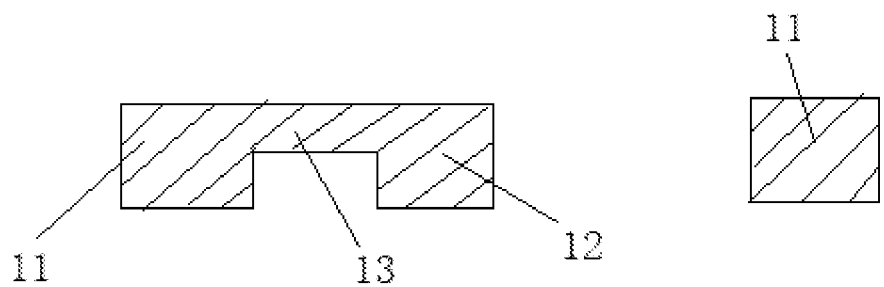
FIG. 2 is a sectional view along line A-A of FIG. 1.
Figure 3:
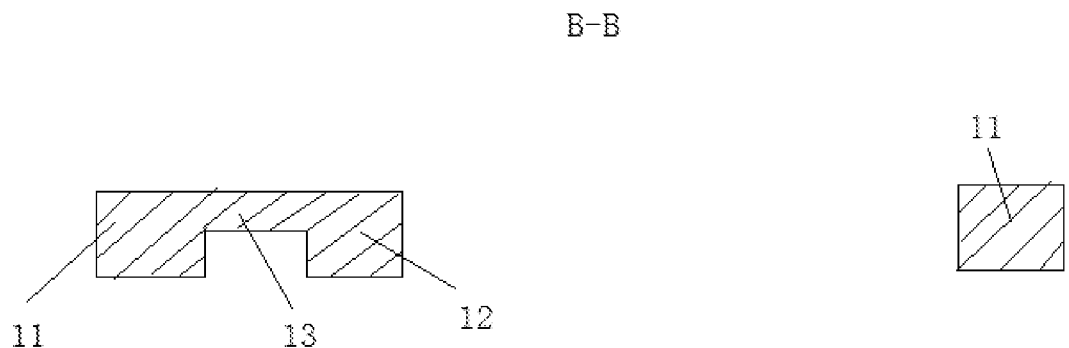
FIG. 3 is a sectional view along line B-B of FIG. 1.

Referring to FIGS. 2-3, the connection bridge 13 is spaced apart from (not in contact with) the surface of the substrate. The connection bridge 13 has a thickness smaller than that of the island shelter 12 and also smaller than that of the mask frame 11. That is, the connection bridge 13 is suspended above the substrate. In this embodiment, the width L of the connection bridge 13 meets the condition that $0.1 \text{ mm} \leq L \leq 0.5 \text{ mm}$. As a result, when the evaporation material is deposited in the evaporation coating process, the deposited layer parts on both sides of the connection bridge 13 can diffuse through the gap under the connection bridge 13 and become interconnected together, so that the thickness of the deposited layer under the connection bridge 13 can meet the basic requirements, that is to say, the evaporation material enters the gap thereunder between the connection bridge 13 and the substrate from both sides of the connection bridge 13, so as to interconnect the evaporation material in the open area on both sides of the connection bridge, thereby preventing the situation that the area under the connection bridge cannot be covered by the evaporation material due to the presence of the connection bridge, and thus a secondary evaporation coating process performed on the area shielded by the connection bridge for ensuring the display integrity can be dispensed with.

Figure 7:
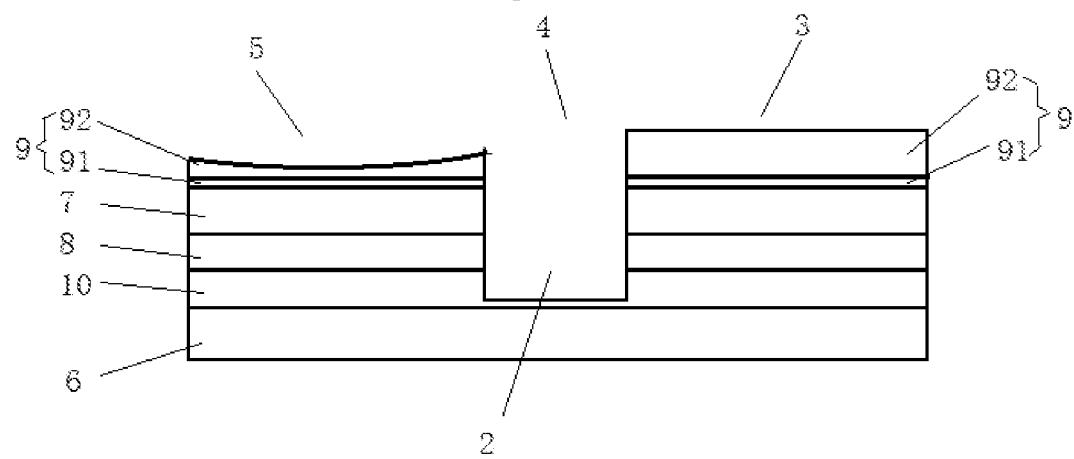
Figure 8:
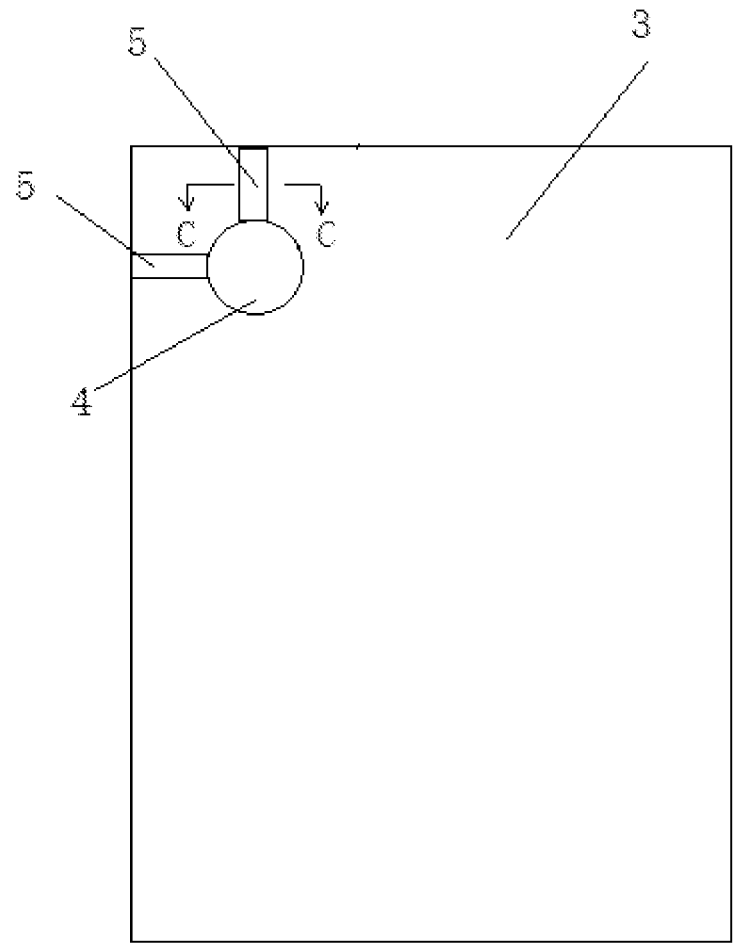
FIG. 8 is a structural schematic diagram of a display device of the present application.

Referring to FIGS. 7-8, this embodiment provides a display device, comprising a display area 3, at least one non-display area 4, and a transitional-display area 5, wherein the display area 3 is arranged to surround the non-display area 4; the transitional-display area 5 is adjacent to both the non-display area 4 and the display area 3, wherein the transitional-display area 5 connects the non-display area 4 to an edge of the display area 3. When more than one non-display area 4 is provided, the transitional-display area 5 may also interconnect two neighboring non-display areas 4.

In this embodiment, a thickness of a first electrode in the transitional-display area 5 is smaller than or equal to a thickness of the first electrode in the display area 3, and the first electrode in the display area 3 is connected with the first electrode in the transitional-display area 5 to form a planar electrode.

The display area 3 and the transitional-display area 5 each comprises a substrate 6, with an array circuit 10, an anode layer 8, an OLED light-emitting layer 7 and a cathode layer 9 sequentially stacked on the substrate 6. Both the display area 3 and the transitional-display area 5 are used to display static or dynamic images, the difference thereof lies in that the thickness of the first electrode in the transitional-display area 5 is smaller than or equal to the thickness of the first electrode in the display area 3. In this embodiment, the first electrode has a thickness difference within the transitional-display area 5, wherein a thickness of the first electrode in an edge part of the transitional-display area 5 is larger than a thickness of the first electrode in a central part of the transitional-display area 5, for example, a thickness of the first electrode at a connection part between the transitional-display area 5 and the display area 3 is larger than a thickness of the first electrode in a central part of the transitional-display area 5, an edge thickness of the first electrode in the transitional-display area 5 is smaller than or equal to a thickness of the first electrode in the display area 3.

As shown in FIGS. 7-8, in this embodiment, the first electrode is a cathode, a thickness of a cathode layer 9 in the transitional-display area 5 is smaller than or equal to a thickness of the cathode layer in the display area 3, and the cathode layer 9 has a thickness difference within the transitional-display area 5. Of course, a thickness of a second electrode, such as an anode layer, in the transitional-display area 5 may also be arranged to be smaller than or equal to a thickness of the anode layer in the display area 3, with a thickness difference within the transitional-display area 5 itself.

Figure 9:
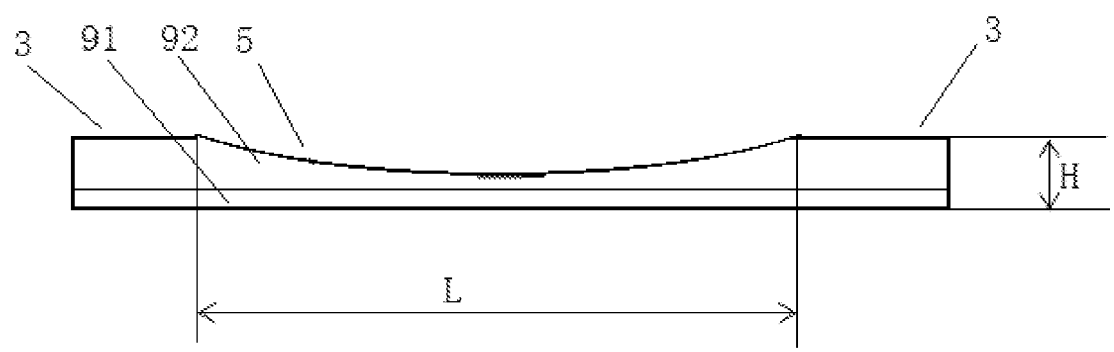
FIG. 9 is a sectional view of the cathode layer of the display device along line C-C of FIG. 8.

As shown in FIGS. 7-8, in this embodiment, the transitional-display area 5 has a strip shape, a thickness of the cathode layer at a connection part between the transitional-display area 5 and the display area 3 is larger than a thickness of the cathode layer in a central part of the transitional-display area 5. As shown in FIG. 9, the cathode layer 9 in the bar-shaped transitional-display area 5 has a thickness difference in the width direction of the transitional-display area 5 (the width direction refers to a direction parallel to a shorter side line of the transitional-display area). The presence of the transitional-display area prevents incomplete display caused by incomplete coverage of the evaporation material in the display device, such as black-edged display formed in an area where a connection bridge is located, thereby improving the display integrity.

The cathode layer 9 of Embodiment 2 is formed by evaporation coating using the mask assembly of Embodiment 1. The display area 3 corresponds to the open area 14 of the mask assembly, the evaporation material is deposited onto the light-emitting layer 7 via the open area 14 of the mask assembly to form the cathode layer 9 shown in FIG. 7. The non-display area 4 corresponds to the area covered by the island shelter 12 in the mask assembly and the transitional-display area 5 corresponds to the area covered by the connection bridge 13 in the mask assembly. As the bottom of the connection bridge 13 in this embodiment is not in contact with the substrate, that is to say, in a process of processing the cathode material by evaporation coating, the parts of cathode material, when being deposited, can diffuse through the gap under the connection bridge 13 and become interconnected together, so that the deposited layer can also become attached to the area under the connection bridge 13, thus, the evaporation material enters the gap thereunder between the connection bridge 13 and the light-emitting layer 7 from both sides of the connection bridge 13, so as to interconnect the parts of material processed by evaporation coating in the open area 14 on both sides of the connection bridge, thereby preventing the situation that the area under the connection bridge 13 cannot be covered by the evaporation material due to the presence of the connection bridge 13.

FIG. 9 is a sectional view of the cathode layer along the width direction of the transitional-display area 5, the surface of the cathode layer 9 in the transitional-display area 5 is a downwardly concave cylindrical surface, both ends of the cylindrical surface are correspondingly connected to the parts of the display area 3 on both sides of the transitional-display area 5 in the width direction, the central concave area of the transitional-display area 5 corresponds to the connection bridge 13 of the mask assembly for forming the cathode layer.

The cathode layer 9 in the transitional-display area 5 is concave towards the substrate 6, wherein the parts connecting to the display area 3 on both sides of the concave site have a thickness larger than that of the central part of the concave site, i.e., in FIG. 9, the thickness of the left and right side parts is larger than the thickness of concave central part. Specifically, the thickness of the cathode layer in the transitional-display area 5 is h, the thickness of the cathode layer in the display area 3 is H, and the following conditions are met: 50 nm≤h≤H, and 100 nm≤H≤180 nm.

The display device of this embodiment also comprises a device unit, the device unit comprises a mounting hole 2 provided in the non-display area 4 and a functional element arranged in the mounting hole 2, and the functional element comprises at least one of a photosensitive element, a camera, a phone, a light sensor, a light emitter.

The manufacturing process of the display device in this embodiment is as follows.

Figure 4:
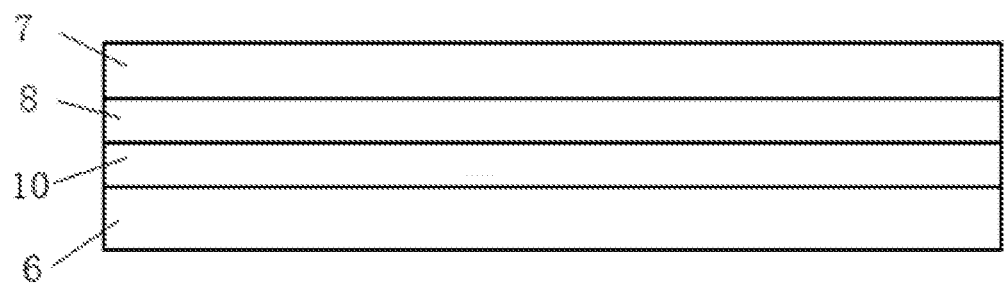
FIGS. 4-7 are schematic diagrams of a manufacturing process of a display device of the present application.

S1: as shown in FIG. 4, providing a substrate 6, and sequentially forming an array circuit 10, an anode layer 8 and an OLED light-emitting layer 7 on the substrate 6.

Figure 5:
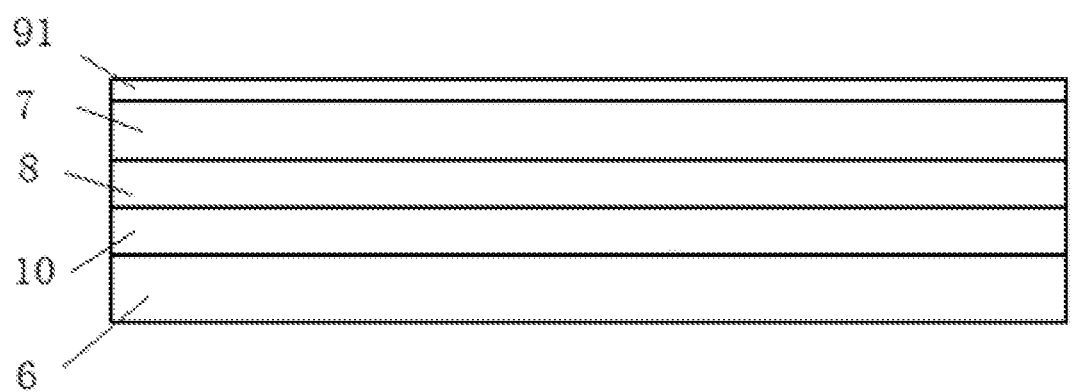

S2: as shown in FIG. 5, forming a first cathode layer 91 upon the light-emitting layer 7 with cathode material processed by evaporation coating, wherein the thickness of the first cathode layer 91 is smaller than a minimum of h, i.e., the thickness of the first cathode layer 91 is smaller than a minimal thickness of the cathode layer in the transitional-display area 5.

Figure 6:
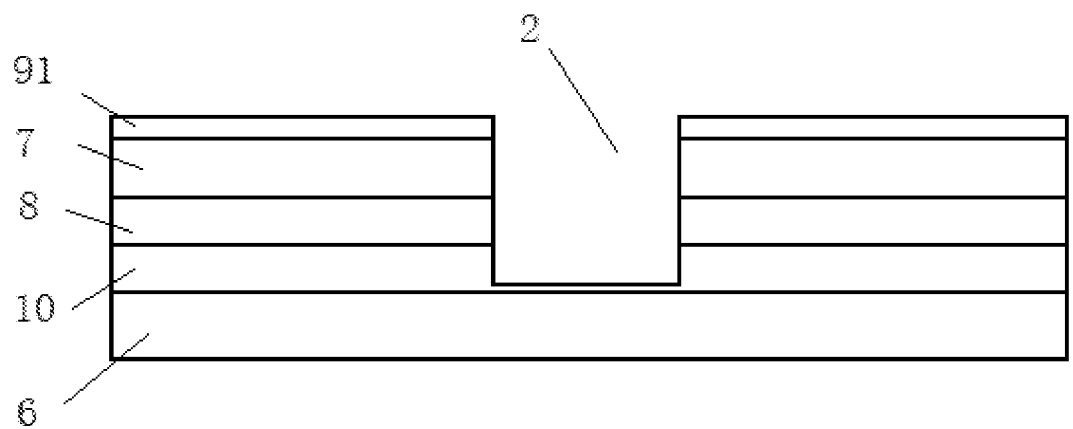

S3: as shown in FIG. 6, forming a mounting hole 2 in a non-display area 4 by etching.

S4: as shown in FIG. 7, using the mask assembly of Embodiment 1 to shield the area where the mounting hole 2 is located, and forming a second cathode layer 92 with cathode material processed by evaporation coating, wherein the second cathode layer 92 covers both a transitional-display area 5 and a display area 3.

Wherein, the first cathode layer 91 produced in the step S2 and the second cathode layer 92 produced in the step S4 together constitute a cathode layer 9 of the display device.

By using the two steps to form the cathode layer, it can be ensured that at least the first cathode layer 91 is present in the transitional-display area 5, so that it is ensured that the transitional-display area 5 is electrically conductive, wherein, as the cathode layer 9 in the transitional-display area 5 has uneven thickness, in order to prevent adverse influence to normal display and ensure luminance uniformity and normal display of the transitional-display area 5, an external drive circuit can be applied later to perform external optical compensation on the display module of the transitional-display area, for example, Demura optical compensation by optical decimation, thereby improving the uniformity of the overall luminance of the display device, and preventing incidental images from happening.

What is claimed is:

1. A method of manufacturing a display device, comprising the steps of:
   S1: providing a substrate, and sequentially forming an array circuit, an anode layer and a light-emitting layer on the substrate;
   S2: forming a first cathode layer upon the light-emitting layer with cathode material processed by evaporation coating;
   S3: forming a mounting hole in a non-display area by etching;
   S4: using a mask assembly to shield an area where the mounting hole is located, and forming a second cathode layer with cathode material processed by evaporation coating;
   wherein the second cathode layer covers both a transitional-display area and a display area, and the first cathode layer produced in the step S2 and the second cathode layer produced in the step S4 together constitute a cathode layer of the display device;
   wherein the mask assembly used in the step S4 comprises:
      a mask frame, having an open area and configured to be supported on a surface of the substrate during evaporation coating in the step S4;
      a plurality of island shelters, located in the open area and configured to be in contact with the surface of the substrate through the mounting hole during evaporation coating in the step S4; and
      at least one connection bridge, configured to be spaced apart from and suspended above the surface of the substrate to form a gap between the at least one connection bridge and the surface of the substrate during evaporation coating in the step S4,
   wherein at least one of the plurality of island shelters is connected to the mask frame or a neighboring island shelter of the plurality of the island shelters via the at least one connection bridge.

2. The method according to claim 1, wherein, the first cathode layer produced in the step S2 has a thickness less than or equal to 50 nm.

3. The method according to claim 1, wherein, for the mask assembly used in the step S4, the plurality of the island shelters comprise a round shelter plate and/or a rectangular shelter plate.

4. The method according to claim 1, wherein, for the mask assembly used in the step S4, the at least one connection bridge has a thickness smaller than that of the at least one of the plurality of island shelters.

5. The method according to claim 4, wherein, for the mask assembly used in the step S4, the at least one connection bridge has a stripe shape.

6. The method according to claim 4, wherein, for the mask assembly used in the step S4, the at least one connection bridge is arranged along a straight line that passes through a center of the at least one of the plurality of island shelters.

7. The method according to claim 1, wherein, for the mask assembly used in the step S4, the at least one connection bridge comprises two connection bridges.

* * * * *